United States Patent
Huang et al.

(10) Patent No.: US 9,466,535 B2
(45) Date of Patent: Oct. 11, 2016

(54) METHOD OF FORMING TARGET PATTERNS

(71) Applicant: United Microelectronics Corp., Hsinchu (TW)

(72) Inventors: Po-Cheng Huang, Kaohsiung (TW); Kun-Ju Li, Tainan (TW); Yu-Ting Li, Chiayi (TW); Chih-Hsun Lin, Pingtung County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/636,940

(22) Filed: Mar. 3, 2015

(65) Prior Publication Data

US 2016/0260637 A1 Sep. 8, 2016

(51) Int. Cl.
*H01L 29/66* (2006.01)
*H01L 21/8234* (2006.01)
*H01L 21/033* (2006.01)
*H01L 21/306* (2006.01)

(52) U.S. Cl.
CPC ... *H01L 21/823437* (2013.01); *H01L 21/0332* (2013.01); *H01L 21/0335* (2013.01); *H01L 21/0337* (2013.01); *H01L 21/30625* (2013.01); *H01L 21/823431* (2013.01); *H01L 29/6681* (2013.01); *H01L 29/66545* (2013.01)

(58) Field of Classification Search
CPC .............. H01L 21/8232; H01L 29/66007; H01L 29/66409
See application file for complete search history.

(56) References Cited

U.S. PATENT DOCUMENTS

2007/0054448 A1* 3/2007 Choi ............... H01L 21/28273
438/201
2015/0041913 A1* 2/2015 An .................. H01L 29/7856
257/369

FOREIGN PATENT DOCUMENTS

WO  2010096213  8/2010

* cited by examiner

*Primary Examiner* — Cheung Lee
(74) *Attorney, Agent, or Firm* — J.C. Patents

(57) ABSTRACT

A method of forming target patterns is disclosed. A substrate with multiple fins is provided. A plurality of mask patterns is formed across the fins and in at least a part of non-target areas. Target patterns are formed respectively in trenches between the mask patterns. The mask patterns are removed. With the disclosed method, the target patterns can be formed with substantially equal thickness. In the case that the target patterns are dummy gates, the conventional defects such as dummy gate residues or gate trench widening caused by uneven thicknesses are not observed upon the dummy gate removal step.

19 Claims, 4 Drawing Sheets

METHOD OF FORMING TARGET PATTERNS

BACKGROUND OF THE INVENTION

1. Field of Invention

The present invention relates to a semiconductor process, and more particularly to a method of forming target patterns.

2. Description of Related Art

MOS is a basic structure widely applied to various semiconductor devices, such as memory devices, image sensors and display devices. The traditional MOS transistor is difficult to scale down due to the limitation of the fabricating process, and a multi-gate transistor with better properties is therefore developed. One example is the fin-type field effect transistor (FinFET) with multiple three-dimensional (3D) fins.

In a typical FinFET process, a thick dummy gate layer is formed on a substrate and a chemical mechanical polishing (CMP) step is performed to make the dummy gate layer flat. However, during the CMP step, the loading effect is serious due to the bad topography caused by the fin structure, so the thickness variation of the dummy gate layer within die or wafer is up to about 80 angstroms. Therefore, dummy gates are subsequently formed with uneven thicknesses. Such variation in thickness is undesirable and may affect the removal efficiency of the dummy gates, thereby deteriorating the performance of the metal-gate device.

SUMMARY OF THE INVENTION

Accordingly, the present invention provides a method of forming target patterns, in which the target patterns (e.g. dummy gates) can be formed with substantially equal thickness, and the problems resulted from uneven thicknesses can be avoided.

The present invention provides a method of forming target patterns. A substrate with multiple fins is provided. A plurality of mask patterns is formed across the fins and in at least a part of non-target areas. Target patterns are formed respectively in trenches between the mask patterns. The mask patterns are removed.

According to an embodiment of the present invention, the target patterns are dummy gates.

According to an embodiment of the present invention, a width of each mask pattern is substantially the same or less than a width of the corresponding non-target area.

According to an embodiment of the present invention, the mask patterns are formed in all of the non-target areas.

According to an embodiment of the present invention, the mask patterns are formed only in a part of the non-target areas.

According to an embodiment of the present invention, the target patterns are partially removed during the step of removing the mask patterns, so that the remaining target patterns are provided in all of target areas.

According to an embodiment of the present invention, the method further includes forming a hard mask layer on the target patterns and on the mask patterns before the step of removing the mask patterns.

According to an embodiment of the present invention, a portion of the hard mask layer is removed during the step of removing the mask patterns.

According to an embodiment of the present invention, the hard mask layer is a single layer or a multi-layer structure.

According to an embodiment of the present invention, the step of forming the target patterns includes forming a target material layer on the substrate filling in the trenches between the mask patterns, and removing a portion of the target material layer until top surfaces of the mask patterns are exposed.

According to an embodiment of the present invention, the step of removing the portion of the target material layer includes performing a chemical mechanical polishing (CMP) process.

According to an embodiment of the present invention, a polishing selectivity ratio of the target material layer to the mask patterns is from about 10:1 to 100:1.

According to an embodiment of the present invention, the method further includes forming an interfacial layer on the substrate covering the fins before the step of forming the mask patterns, wherein the mask patterns expose a portion of the interfacial layer.

According to an embodiment of the present invention, the interfacial layer includes silicon oxide, silicon nitride or silicon oxynitride.

According to an embodiment of the present invention, the trenches between the mask patterns have different widths.

According to an embodiment of the present invention, the trenches between the mask patterns have substantially the same width.

According to an embodiment of the present invention, the mask patterns and the target patterns have different polishing selectivities but similar etching selectivities.

According to an embodiment of the present invention, the mask patterns include silicon oxide, silicon nitride, silicon oxynitride or a combination thereof.

According to an embodiment of the present invention, the target patterns include polycrystalline silicon, amorphous silicon, microcrystal silicon or a combination thereof According to an embodiment of the present invention, the fins extend in a first direction, and the mask patterns extend in a second direction different from the first direction.

In view of the above, in the present invention, mask patterns in at least a part of non-target areas can be provided before the CMP step is performed to the target material layer. In such manner, the CMP step of the invention is free of the CMP loading effect since the mask patterns can serve as a polishing stop layer, and target patterns can be subsequently formed with even and equal thickness. Therefore, in the case that the target patterns are dummy gates, when the dummy gates are removed, the conventional defects such as dummy gate residues due to under-etching or gate trench widening due to over-etching are not observed, and the performance of the device is accordingly improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
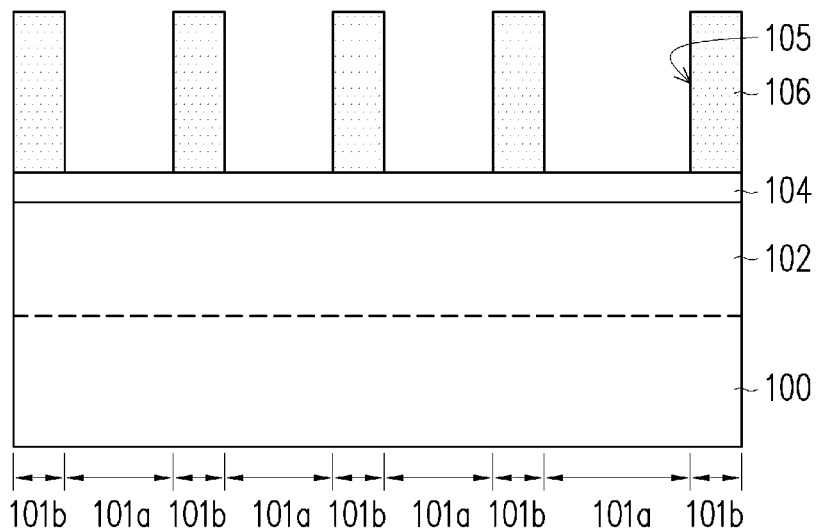
FIG. 1A to FIG. 1D are schematic cross-sectional views illustrating a method of forming target patterns according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1D are schematic cross-sectional views illustrating a method of forming target patterns according to an embodiment of the present invention.

Referring to FIG. 1A, a substrate 100 with multiple fins 102 is provided. The substrate 100 can be a semiconductor substrate such as a silicon-containing substrate, and the fins 102 can be formed to extend in a first direction. Besides, the substrate 100 has target areas 101a and non-target areas 101b. In this embodiment, four target areas 101a and five non-target areas 101b are arranged alternatively, as shown in FIG. 1A, but the present invention is not limited thereto. That is, the number of the target areas 101a or non-target areas 101b is not limited by this embodiment, and the non-target areas 101b (or target areas 101a) can be configured to surround the target areas 101a (or non-target areas 101b) upon the process requirements. Besides, each of the target areas 101a and the non-target areas 101b is formed across the active regions and isolation regions of the device.

Thereafter, an interfacial layer 104 is formed on the substrate 100 covering the fins 102. The interfacial layer 104 includes silicon oxide, silicon nitride or silicon oxynitride, and the forming method thereof includes performing a thermal oxide process or a suitable deposition process such as chemical vapor deposition (CVD) or atomic layer deposition (ALD).

Afterwards, a plurality of mask patterns 106 is formed on the interfacial layer 104, across the fins 102 and in at least a part of non-target areas 101b. In this embodiment, the mask patterns 106 are formed in all of the non-target areas 101b. Besides, the mask patterns 106 expose a portion of the interfacial layer 104, and a trench 105 is formed between the adjacent mask patterns 106. In an embodiment, the mask patterns 106 can be formed to extend in a second direction different from the first direction. For example, the second direction is perpendicular to the first direction.

The mask patterns 106 includes silicon oxide, silicon nitride, silicon oxynitride or a combination thereof. The method of forming the mask patterns 106 includes forming a mask material layer on the substrate 100 through a CVD process and then patterning the mask material layer through photolithography and etching processes. In an embodiment, the mask patterns 106 include a material different from that of the interfacial layer 104. For example, the mask patterns 106 include silicon nitride and the interfacial layer 104 includes silicon oxide, but the present invention is not limited thereto.

The said embodiment in which the trenches 105 between the mask patterns 106 have different widths is provided for illustration purposes, and is not construed as limiting the present invention. In another embodiment, the trenches 105 between the mask patterns 106 can have substantially the same width. That is, the pitch of the mask patterns 106 can be constant or inconstant.

Figure 1B:
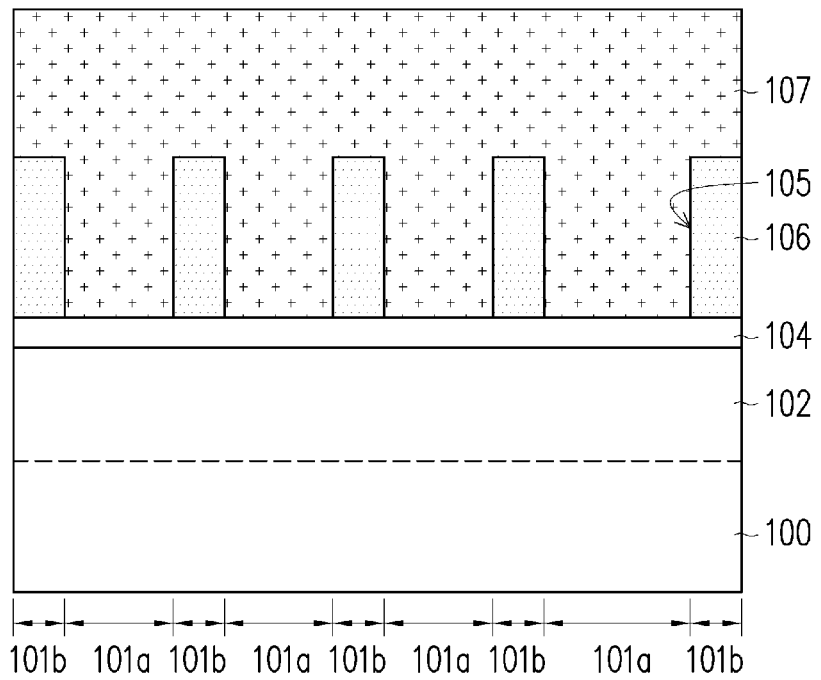
Figure 1C:
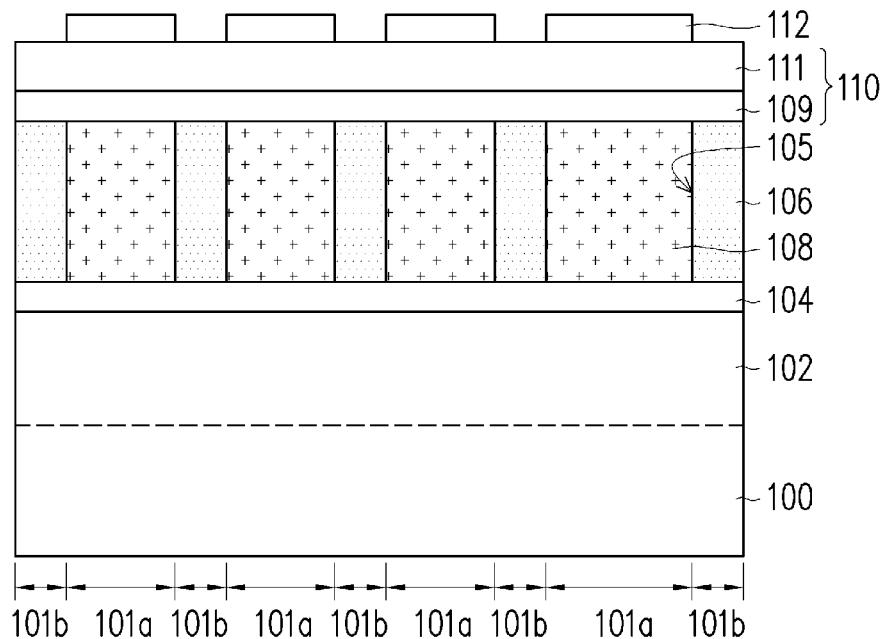

Referring to FIG. 1B and FIG. 1C, target patterns 108 are formed respectively in trenches 105 between the mask patterns 106. A target material layer 107 is formed on the substrate 100 filling in the trenches 105 between the mask patterns 106, as shown in FIG. 1B. The target material layer 107 includes polycrystalline silicon, amorphous silicon, microcrystal silicon or a combination thereof, and the forming method thereof includes performing a suitable deposition process such as CVD or ALD.

A portion of the target material layer 107 is then removed until top surfaces of the mask patterns 106 are exposed, and thus, the target patterns 108 are respectively formed in the trenches 105, as shown in FIG. 1C. The step of removing the portion of the target material layer 107 includes performing a chemical mechanical polishing (CMP) process.

In an embodiment, the target material layer 107 can be a dummy gate layer, and the target patterns 108 can be dummy gates.

It is noted that each mask pattern 106 of the invention serves as a polishing stop layer during the said CMP process, so the conventional loading effect and therefore the thickness variation of the target patterns 108 within die or wafer are not observed in the present invention. Specifically, the target patterns 108 can be formed with substantially equal thickness. In an embodiment, the thickness variation of the target patterns 108 is about 30 angstroms or lower.

It is also noted that the target material layer 107 and the mask patterns 106 have different polishing selectivities but similar etching selectivities. Specifically, the polishing selectivity ratio of the target material layer 107 to the mask patterns 106 is from about 10:1 to 100:1, while the etching selectivity ratio of the target material layer 107 to the mask patterns 106 is from about 0.9:1 to 1.1:1. For example, the mask patterns 106 include silicon nitride and the target material layer 107 includes amorphous silicon, but the present invention is not limited thereto. Therefore, in the present invention, a CMP step rather than an etching back step is conducted to partially remove the target material layer 107 by using each mask pattern 106 as a polishing stop layer.

Referring to FIG. 1C, a hard mask layer 110 is formed on the target patterns 108 and on the mask patterns 106. The hard mask layer 110 serves as a protecting layer to protect the material in the target areas 101a (e.g. the target patterns 108 in this embodiment) from being damaged during the subsequent processes such as SiGe source/drain processes.

The hard mask layer 110 includes silicon oxide, silicon nitride, silicon oxynitride or a combination thereof. The hard mask layer 110 can be a single layer or a multi-layer structure. In an embodiment, the hard mask layer 110 includes, for example but not limited thereto, a lower silicon nitride layer 109 and an upper silicon oxide layer 111. Thereafter, photoresist patterns 112 are formed on the hard mask layer 110 respectively corresponding to the target patterns 108 in all of the target areas 101a.

Figure 1D:
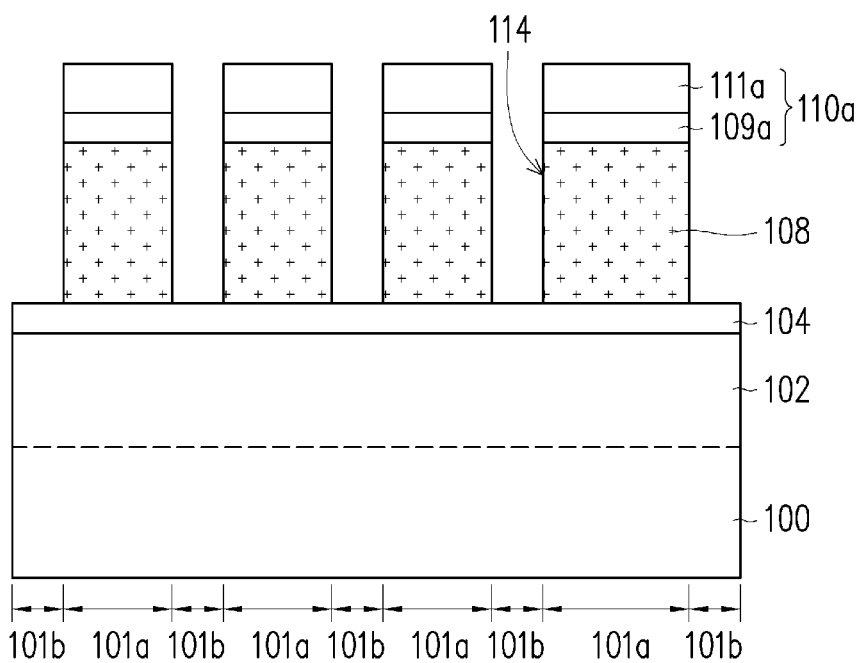

Referring to FIG. 1D, the mask patterns 106 are removed. Specifically, the mask patterns 106 and a portion of the hard mask layer 110 thereon are removed through an etching step by using the photoresist patterns 112 as a mask, and thus, a trench 114 is formed between the adjacent target patterns 108 and a hard mask pattern 110a including a lower silicon nitride pattern 109a and an upper silicon oxide pattern 111a is formed on each target pattern 108. The photoresist patterns 112 are then removed.

In view of the above, the mask patterns 106 are formed in all of the non-target areas 101b (as shown in FIG. 1A) and function as a polishing stop layer to avoid the conventional CMP loading effect, but the present invention is not limited thereto. In another embodiment, the mask patterns can be formed only in a part of the non-target areas.

FIG. 2A to FIG. 2D are schematic cross-sectional views illustrating a method of forming target patterns according to another embodiment of the present invention.

Figure 2A:
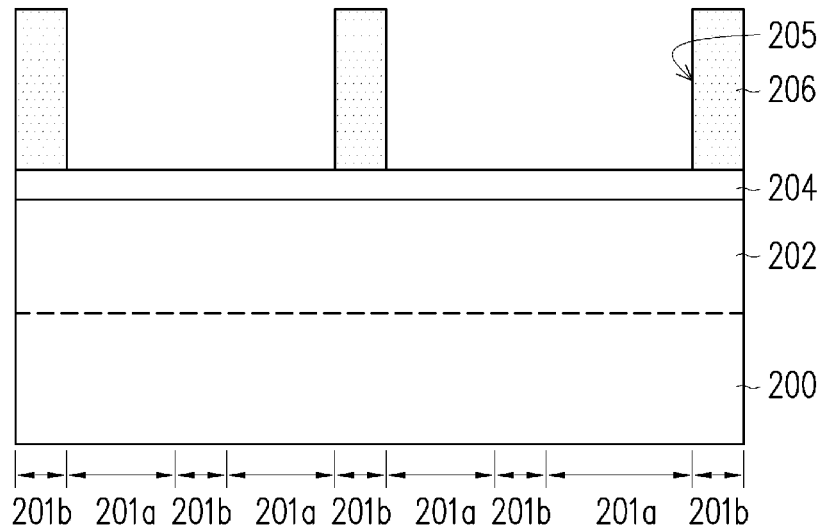
FIG. 2A to FIG. 2D are schematic cross-sectional views illustrating a method of forming target patterns according to another embodiment of the present invention.

Referring to FIG. 2A, a substrate 200 with multiple fins 202 extending in a first direction is provided. Besides, the substrate 200 has target areas 201a and non-target areas 201b. In an embodiment, the target areas 201a and the non-target areas 201b are arranged alternatively, as shown in FIG. 2A.

Thereafter, an interfacial layer 204 is formed on the substrate 200 covering the fins 202. Afterwards, a plurality of mask patterns 206 is formed on the interfacial layer 204, across the fins 202 and in at least a part of non-target areas 201b. In this embodiment, the mask patterns 206 are formed only in a part of the non-target areas 201b. For example, there are five non-target areas 201b provided in FIG. 2A, but the mask patterns 206 merely correspond to three of the non-target areas 201b. In such manner, without concerning the space constraint between the mask patterns 206, the process window for defining the mask patterns 206 is greater than that for defining the mask patterns 106.

Besides, the mask patterns 206 expose a portion of the interfacial layer 204, and a trench 205 is formed between the adjacent mask patterns 206. In an embodiment, the mask patterns 206 can be formed to extend in a second direction different from the first direction. In addition, the trenches 205 between the mask patterns 206 can have different widths or substantially the same width. That is, the pitch of the mask patterns 206 can be constant or inconstant.

Figure 2B:
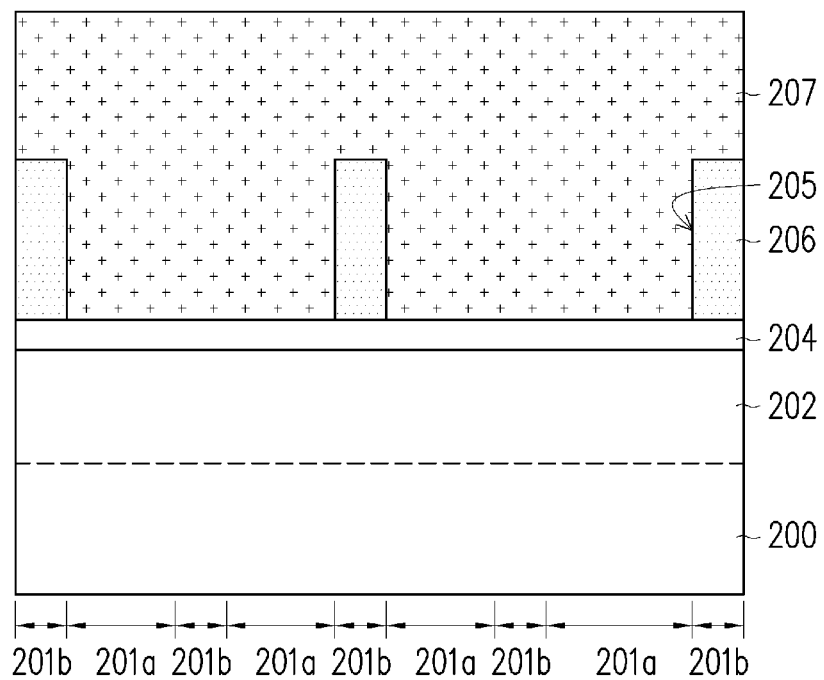
Figure 2C:
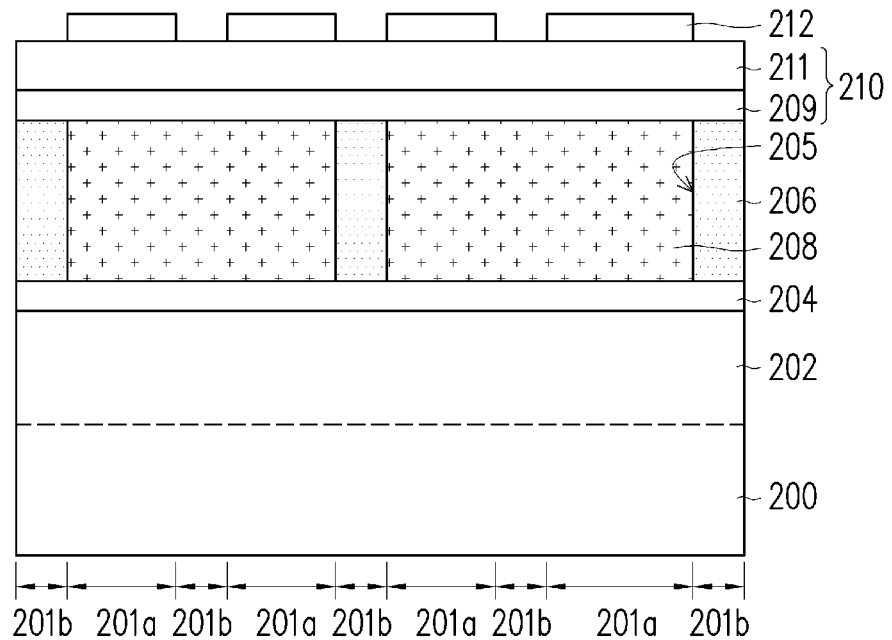

Referring to FIG. 2B and FIG. 2C, target patterns 208 are formed respectively in trenches 205 between the mask patterns 206. A target material layer 207 is formed on the substrate 200 filling in the trenches 205 between the mask patterns 206, as shown in FIG. 2B. A portion of the target material layer 207 is then removed until top surfaces of the mask patterns 206 are exposed, and thus, the target patterns 208 are respectively formed in the trenches 205, as shown in FIG. 2C. Besides, the target material layer 107 and the mask patterns 106 have different polishing selectivities but similar etching selectivities, so a CMP step rather than an etching back step is conducted to partially remove the target material layer 207. The said CMP step is stopped on the top surfaces of the mask patterns 206.

In an embodiment, the target material layer 207 can be a dummy gate layer, and the target patterns 208 can be dummy gates.

Referring to FIG. 2C, a hard mask layer 210 is formed on the target patterns 208 and on the mask patterns 206. The hard mask layer 210 serves as a protecting layer to protect the material in the target areas 201a from being damaged during the subsequent processes such as SiGe source/drain processes.

The hard mask layer 210 can be a single layer or a multi-layer structure. In an embodiment, the hard mask layer 210 includes, for example but not limited thereto, a lower silicon nitride layer 209 and an upper silicon oxide layer 211. Thereafter, photoresist patterns 212 are formed on the hard mask layer 110 respectively corresponding to all of the target areas 201a.

Figure 2D:
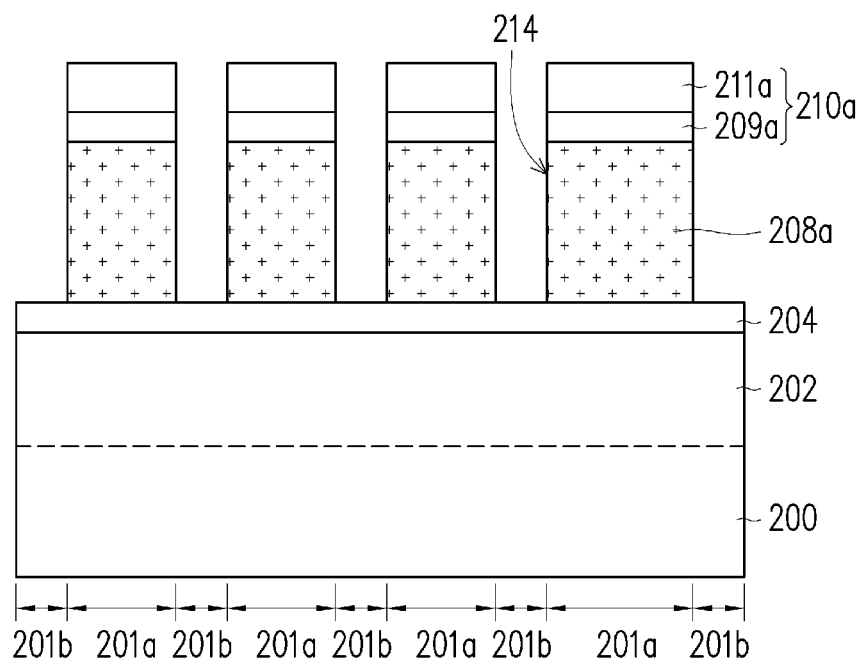

Referring to FIG. 2D, the mask patterns 206 are removed. Specifically, the mask patterns 206 with a portion of the hard mask layer 210 thereon and a part of the target patterns 208 are removed through an etching step by using the photoresist patterns 212 as a mask, and thus, a trench 214 is formed between the adjacent target patterns 208a and a hard mask pattern 210a including a lower silicon nitride pattern 209a and an upper silicon oxide pattern 211a is formed on each remaining target pattern 208a. In other words, the target patterns 208 are partially removed during the step of removing the mask patterns 206, so that the remaining target patterns 208a are provided in all of target areas 201a. The photoresist patterns 212 are then removed.

The said embodiments in which the method of the invention is applied to a FinFET process and the target patterns are dummy gates are provided for illustration purposes, and are not construed as limiting the present invention. In another embodiment, the method of the invention can be applied to a planar device process, in which the substrate can be a bulk substrate without fins, and each target pattern can be a polysilicon gate and retains its status as is after the target patterns are formed.

Besides, in the said embodiments, the width of each mask pattern is substantially the same as that of the corresponding non-target area, but the present invention not limited thereto. In another embodiment, the width of each mask pattern can be smaller than that of the corresponding non-target area.

In an embodiment, for a metal gate (high-k last) process, the following process steps after removing the mask patterns include forming SiGe source/drain regions; forming a dielectric layer to fill trenches between the target patterns (e.g. dummy gates); removing the hard mask patterns, the target patterns and the underlying interfacial layer to form gate trenches in the dielectric layer; and filling a gate dielectric layer (e.g. silicon oxide), a high-k layer (e.g. $HfO_2$), a barrier layer (e.g. TiN) and a composite metal layer including a work function metal layer (e.g. TiAl or TiN) and a low-resistivity metal layer (e.g. Al or Cu) in the gate trenches. These steps are well-known to persons having ordinary skill in the art and are not iterated herein.

In summary, with the method of the invention, the target patterns can be formed with substantially equal thickness. In the case that target patterns are dummy gates, the conventional defects such as dummy gate residues or gate trench widening caused by uneven thicknesses are not observed upon the dummy gate removal step. Specifically, in the invention, mask patterns as a polishing stop layer are provided in at least a part of non-target areas before the CMP step is performed to the target material layer (e.g. gate dummy layer), so the step for defining target patterns (e.g. dummy gates) is free of the CMP loading effect. Therefore, the thickness variation of the target patterns (e.g. dummy gates) within die or wafer does not occur. When the dummy gates are removed, the dummy gates can be effectively removed at the same time without generating undesired defects, so the performance of the metal-gate device is accordingly improved, and competitive advantages over competitors are thus achieved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming target patterns, comprising:
    providing a substrate with multiple fins;
    forming a plurality of mask patterns across the fins and in at least a part of non-target areas;
    forming target patterns respectively in trenches between the mask patterns; and
    removing the mask patterns,
    wherein the target patterns are dummy gates.

2. The method of claim 1, wherein a width of each mask pattern is substantially the same or less than a width of the corresponding non-target area.

3. The method of claim 1, wherein the mask patterns are formed in all of the non-target areas.

4. The method of claim 1, wherein the mask patterns are formed only in a part of the non-target areas.

5. The method of claim 4, wherein the target patterns are partially removed during the step of removing the mask patterns, so that the remaining target patterns are provided in all of target areas.

6. The method of claim 1, further comprising forming a hard mask layer on the target patterns and on the mask patterns before the step of removing the mask patterns.

7. The method of claim 6, wherein a portion of the hard mask layer is removed during the step of removing the mask patterns.

8. The method of claim 6, wherein the hard mask layer is a single layer or a multi-layer structure.

9. The method of claim 1, wherein the step of forming the target patterns comprises:
   forming a target material layer on the substrate filling in the trenches between the mask patterns; and
   removing a portion of the target material layer until top surfaces of the mask patterns are exposed.

10. The method of claim 9, wherein the step of removing the portion of the target material layer comprises performing a chemical mechanical polishing process.

11. The method of claim 10, wherein a polishing selectivity ratio of the target material layer to the mask patterns is from about 10:1 to 100:1.

12. The method of claim 1, further comprising forming an interfacial layer on the substrate covering the fins before the step of forming the mask patterns, wherein the mask patterns expose a portion of the interfacial layer.

13. The method of claim 12, wherein the interfacial layer comprises silicon oxide, silicon nitride or silicon oxynitirde.

14. The method of claim 1, wherein the trenches between the mask patterns have different widths.

15. The method of claim 1, wherein the trenches between the mask patterns have substantially the same width.

16. The method of claim 1, wherein the mask patterns and the target patterns have different polishing selectivities but similar etching selectivities.

17. The method of claim 1, wherein the mask patterns comprises silicon oxide, silicon nitride, silicon oxynitride or a combination thereof.

18. The method of claim 1, wherein the target patterns comprises polycrystalline silicon, amorphous silicon, microcrystal silicon or a combination thereof.

19. The method of claim 1, wherein the fins extend in a first direction, and the mask patterns extend in a second direction different from the first direction.

* * * * *